United States Patent
Hayashi (10) Patent No.: US 11,936,005 B2
(45) Date of Patent: Mar. 19, 2024

(54) POWER SUPPLY DEVICE

(71) Applicant: AESC Japan Ltd., Kanagawa (JP)

(72) Inventor: Kazuomi Hayashi, Kanagawa (JP)

(73) Assignee: AESC Japan Ltd., Kanagawa (JP)

( * ) Notice: Subject to any disclaimer, the term of this patent is extended or adjusted under 35 U.S.C. 154(b) by 701 days.

(21) Appl. No.: 16/975,913

(22) PCT Filed: Mar. 20, 2019

(86) PCT No.: PCT/JP2019/011917
§ 371 (c)(1),
(2) Date: Aug. 26, 2020

(87) PCT Pub. No.: WO2019/188731
PCT Pub. Date: Oct. 3, 2019

(65) Prior Publication Data
US 2021/0005938 A1 Jan. 7, 2021

(30) Foreign Application Priority Data
Mar. 26, 2018 (JP) .................................. 2018-058456

(51) Int. Cl.
*H01M 10/42* (2006.01)
*B60L 3/00* (2019.01)
*G01R 31/371* (2019.01)
*H01M 10/48* (2006.01)

(52) U.S. Cl.
CPC ......... *H01M 10/425* (2013.01); *B60L 3/0046* (2013.01); *G01R 31/371* (2019.01); *H01M 10/48* (2013.01); *H01M 10/482* (2013.01); *H01M 2010/4278* (2013.01); *H01M 2220/20* (2013.01)

(58) Field of Classification Search
CPC .. H01M 10/425; H01M 10/482; G01R 31/371
See application file for complete search history.

(56) References Cited

U.S. PATENT DOCUMENTS

2015/0132615 A1* 5/2015 Yun ..................... H01M 10/488
429/61
2018/0254651 A1* 9/2018 Hallmark .............. H02J 7/0013

FOREIGN PATENT DOCUMENTS

JP 2003-209907 A 7/2003

OTHER PUBLICATIONS

International Search Report issued in corresponding International Patent Application No. PCT/JP2019/011917 dated May 21, 2019.

* cited by examiner

*Primary Examiner* — Karie O'Neill Apicella
(74) *Attorney, Agent, or Firm* — Morgan, Lewis & Bockius LLP (57) ABSTRACT

A power supply device includes a plurality of battery packs, and a plurality of battery controllers having a master-slave configuration and corresponding to the plurality of battery packs in a one-to-one correspondence.

10 Claims, 7 Drawing Sheets

POWER SUPPLY DEVICE

TECHNICAL FIELD

The present disclosure relates to a power supply device including a plurality of battery packs and a plurality of battery controllers corresponding to the battery packs, respectively.

BACKGROUND

A type of power supply device is configured to perform a mechanical operation diagnosis of a mechanical component such as a relay (e.g., fused-connection and/or fused-cut-out diagnosis of a relay) or the like, which is provided in each of battery packs, to control an output from each of the battery packs before starting battery control.

As this type of power supply device, there is known a power supply device in which each of a plurality of battery controllers includes a master-slave configuration. Before starting battery control, a failure of a battery pack (e.g., fixation of a relay) is detected by each slave controller under a control of a master controller. The failure diagnosis result is communicated between the master controller and the slave controller (see, e.g., Patent Document 1).

PRIOR ART DOCUMENTS

Patent Document(s)

Patent Document 1: Japanese laid-open publication No. 2003-209907

However, when the plurality of battery controllers, in which communication is performed between the master controller and the slave controller, performs diagnoses of both the battery controllers themselves and the mechanical components, there is a problem that a preparation time until starting the battery control increases depending on how to set a communication scheme.

As for such a problem, Patent Document 1 does not disclose a technique of quickly starting the battery control, with regard to a communication scheme between the master controller and the slave controller when performing a self-diagnosis of the controllers and a diagnosis of mechanical operations of the mechanical components.

Therefore, in the technique described in Patent Document 1, when the self-diagnosis of the controllers and the diagnosis of the mechanical operations of the mechanical components are performed during a system start-up time, there is a possibility that the power supply device cannot be started up early. Accordingly, in the technique described in Patent Document 1, for example, when this kind of power supply device is used as a power supply for traveling of an electric vehicle, there is room for improvement in terms of shortening the start-up time and quickly starting the traveling.

The present disclosure has been made in view of such a problem. The present disclosure is to provide a power supply device capable of shortening a time required for a self-diagnosis of battery controllers and a diagnosis of a mechanical operation of a mechanical component, and hence capable of quickly supplying electric power.

SUMMARY

According to one embodiment of the present disclosure, there is provided a power supply device including: a plurality of battery packs connected in parallel to a load; a plurality of battery controllers corresponding to the plurality of battery packs in a one-to-one correspondence; and a relay configured to control an output from each of the battery packs, wherein the plurality of battery controllers has a master-slave configuration, and each of the battery controllers is configured to execute a self-diagnosis and a mechanical operation diagnosis of a mechanical component including the relay before starting a battery control, wherein each of the plurality of battery controllers includes a communication part configured to perform communication using a first communication scheme and a second communication scheme that has a communication period shorter than a communication period of the first communication scheme, wherein during the self-diagnosis, communication between a master controller and a slave controller is performed by the first communication scheme, and wherein during the mechanical operation diagnosis, communication between the master controller and the slave controller is performed by the second communication scheme.

According to the power supply device of one embodiment of the present disclosure, the plurality of battery controllers has a master-slave configuration and corresponds to the plurality of battery packs in a one-to-one correspondence. During communication between a master controller and a slave controller, different communication schemes are used for the self-diagnosis of the battery controllers and the diagnosis of the mechanical operations. The self-diagnosis of the battery controllers often performs a plurality of diagnostic checks and has a large processing load. Therefore, the communication is performed by a first communication scheme. During the diagnosis of the mechanical operations which is sequentially processed and has a small processing load, the communication is performed by a second communication scheme that has a communication period shorter than a communication period of the first communication scheme. Therefore, according to the present disclosure, it is possible to shorten the time required for a failure diagnosis at the system start-up time and to quickly supply electric power.

DETAILED DESCRIPTION

Hereinafter, an embodiment of the present disclosure is described with reference to the drawings as appropriate. In the present embodiment, an example of a configuration of an in-vehicle power supply device of an electric vehicle is described. The electric vehicle, however, includes a hybrid electric vehicle that uses an engine, which is an internal combustion engine, and an electric motor as vehicle driving sources, and a genuine electric vehicle that uses an electric motor as a sole vehicle driving source. The present disclosure is not limited to an in-vehicle power supply device of an electric vehicle, and may be applied to, for example, a household power supply device.

Each drawing is a schematic one. Therefore, it should be noted that relationships between thicknesses and planar dimensions, ratios, and the like are different from actual ones. The drawings may include portions having different dimensional relationships and ratios. The embodiments described below exemplify an apparatus or a method for embodying the technical idea of the present disclosure. The technical idea of the present disclosure is not intended to specify materials, shapes, structures, and arrangements of components to the following embodiments.

Figure 1:
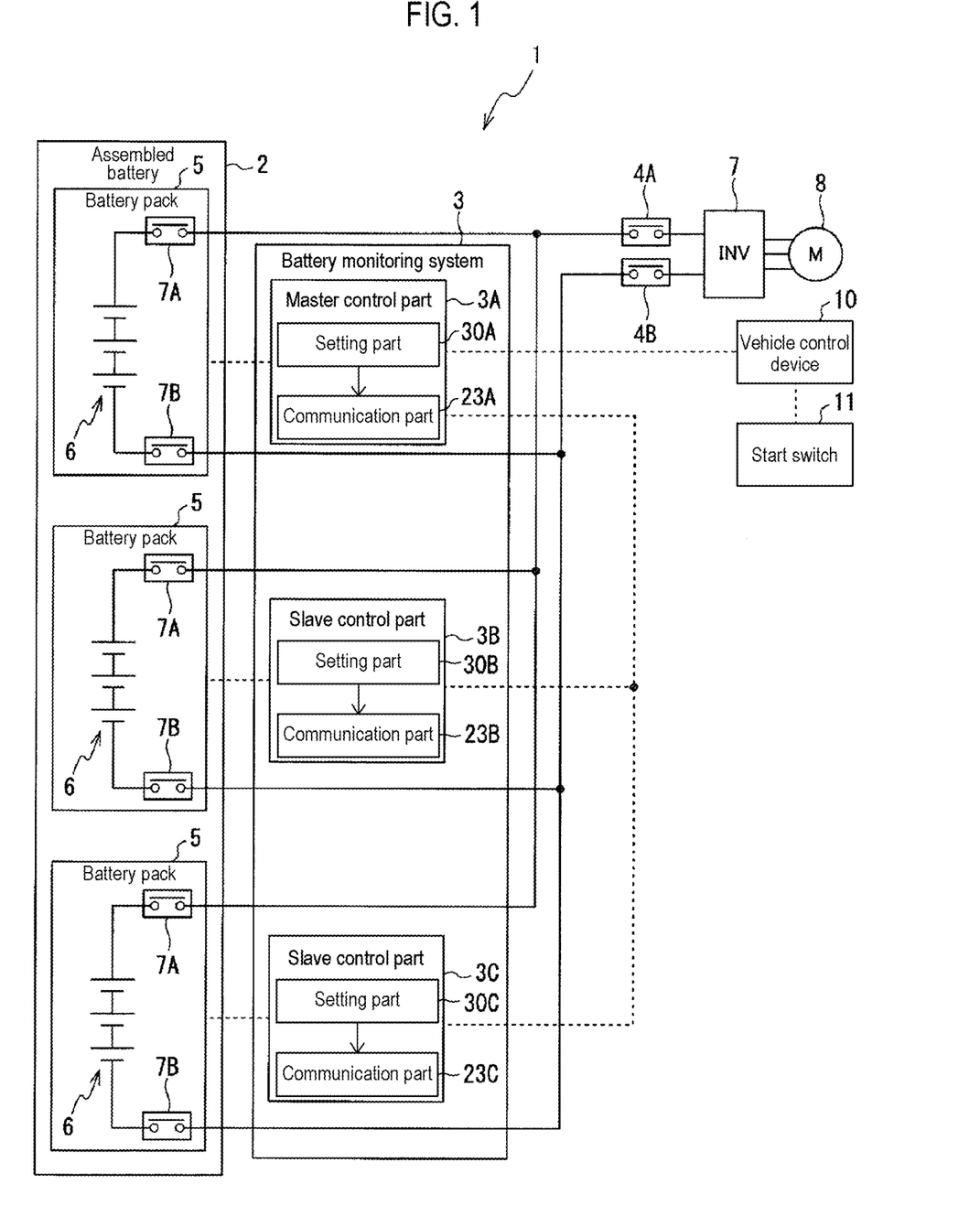
FIG. 1 is a schematic configuration diagram illustrating an embodiment of a power supply device according to one aspect of the present disclosure.

As shown in FIG. 1, a power supply device 1 according to the present embodiment includes an assembled battery 2 and a battery monitoring system 3 (battery controller). The assembled battery 2 includes a plurality of battery packs 5 connected in parallel to an external load.

The power supply device 1 of the present embodiment supplies DC power, which is to be converted to three-phase AC power via an inverter 7, to a motor generator 8 in response to a request from a vehicle's system side. In addition, when charging is necessary in accordance with determination of a vehicle control device 10 mounted on the vehicle's system side, or the like, the power supply device 1 stores DC power converted via the inverter 7 from three-phase AC power generated by the motor generator 8. Here, the "vehicle's system side" includes, in addition to the vehicle control device 10 described later, a communication bus connected to the vehicle control device 10, an air conditioner controller and a light control device, each of which is connected to the communication bus.

Each battery pack 5 includes a plurality of battery cells 6 connected in series, and relays 7A and 7B which are mechanical components for controlling an output from each battery pack 5. Each of the battery cells 6 is formed, for example, of a lithium ion secondary battery or a nickel hydride secondary battery.

When relays 4A and 4B are turned on, each battery pack 5 is connected to an external load such as the motor generator 8 or the like by turning on the relays 7A and 7B that control the output from the battery pack 5, and is disconnected from the external load by turning off the relays 7A and 7B. In the example of FIG. 1, as an example having a plurality of battery packs, there is illustrated an example in which each of three battery packs 5 includes three battery cells 6. However, configuration of the present disclosure is not limited thereto.

The battery monitoring system 3 executes a process related to a failure diagnosis at the time of system start-up, and also executes a process related to management of a state of the assembled battery 2 and a charge and discharge control thereof. The processes executed by the battery monitoring system 3 includes measurement of a voltage and a current of the assembled battery 2, calculation of a state of charge (SOC) and a state of health (SOH) of the assembled battery 2, measurement of a temperature of each battery pack 5, measurement of a voltage of each battery pack 5, adjustment of a power storage amount of each battery pack 5, and the like.

The battery monitoring system 3 includes a plurality of battery controllers 3A, 3B, and 3C provided for the battery packs 5, respectively. In the present embodiment, the three battery controllers 3A, 3B, and 3C are provided according to the number of battery packs 5. With regard to this, the plurality of battery controllers 3A, 3B, and 3C according to the present embodiment have a master-slave configuration. The battery controllers 3A, 3B, and 3C are connected by a communication bus that is different from a communication bus that connects the battery controller 3A and the vehicle control device 10.

That is to say, as shown in FIG. 1, among the plurality of battery controllers 3A, 3B, and 3C, one battery controller 3A is a "master controller" and other battery controllers 3B and 3C are "slave controllers." Hereinafter, the battery controllers 3A, 3B, and 3C are also referred to as a master controller 3A and slave controllers 3B and 3C.

In the battery monitoring system 3, only the master controller 3A communicates with the vehicle control device 10 by a first communication scheme set on the system side. Signals relating to ON and OFF of a start switch 11 are inputted to the master controller 3A by the vehicle control device 10. In addition, the master controller 3A outputs signals regarding a state of each battery pack 5, a voltage of each battery pack 5, a state of failure of each battery pack 5, and the like, to the vehicle control device 10.

The plurality of battery controllers 3A, 3B, and 3C performs master-slave communication based on a predetermined communication scheme including the first communication scheme. In the master-slave communication, communication is performed only between the master controller 3A and the slave controller 3B or the slave controller 3C, and no communication is performed between the slave controllers 3B and 3C.

Next, a functional configuration of each of the battery controllers 3A, 3B, and 3C is described with reference to FIG. 2. Basic configurations of the battery controllers 3A, 3B, and 3C are the same except for software that handles the master-slave configuration. Therefore, the master controller 3A is described in detail, and the functional configuration diagrams and descriptions of the slave controllers 3B and 3C are omitted.

Figure 2:
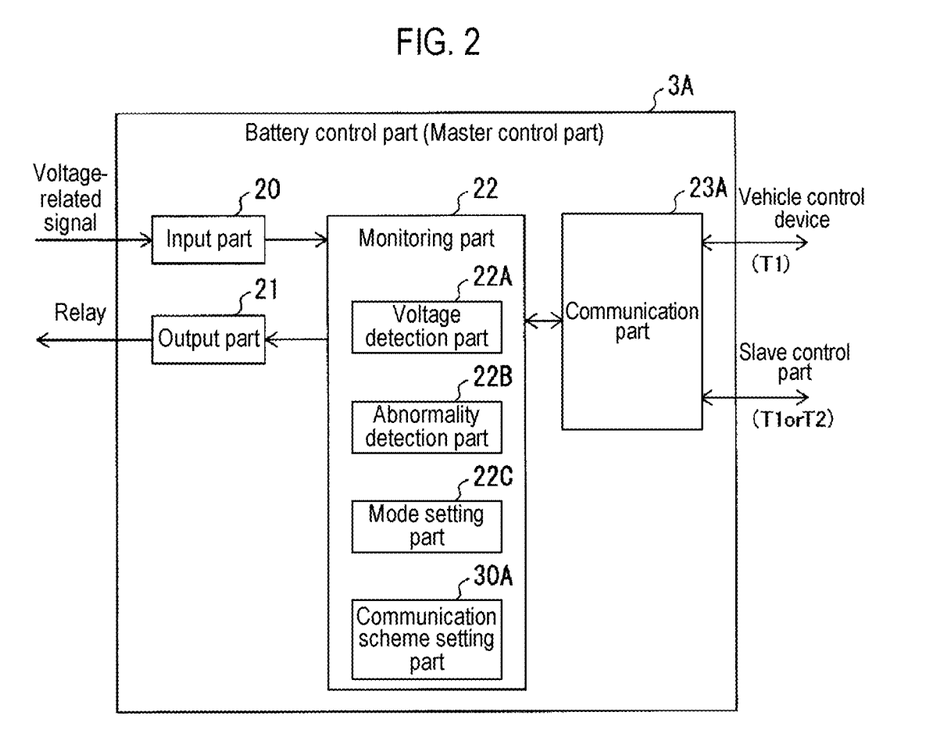
FIG. 2 is a schematic configuration diagram of a battery controller.

As shown in FIG. 2, the master controller 3A includes an input part 20, an output part 21, a monitoring part 22, and a communication part 23A, as functional components. Signals relating to voltage of the battery packs 5 or the battery cells 6 and the like are inputted to the input part 20. The output part 21 outputs a signal for switching ON and OFF of the relays 7A and 7B. The monitoring part 22 includes a voltage detection part 22A, an abnormality detection part 22B, a mode setting part 22C, and a communication scheme setting part 30A.

The monitoring part 22 includes a CPU (Central Processing Unit), a ROM (Read Only Memory), a RAM (Random Access Memory), an internal clock circuit, or the like. Functions of the functional components of the monitoring part 22 are exercised by the CPU reading and executing a program stored in a memory. Communication periods used in the communication schemes described later are determined using an internal clock circuit of the monitoring part 22.

The voltage detection part 22A detects each voltage based on a signal inputted to the input part 20. The abnormality detection part 22B compares the detected voltage with a preset voltage to determine whether each voltage is normal or abnormal, thereby detecting a voltage abnormality. The abnormality detection part 22B performs a failure diagnosis at the time of system start-up, in addition to detecting the voltage abnormality of the battery pack 5 or the battery cell 6.

The mode setting part 22C sets a voltage detection mode to one of a "failure diagnosis mode" and a "normal mode."

When the start switch 11 is turned on, the failure diagnosis mode is activated before charging and discharging by the battery packs 5 is started.

The failure diagnosis mode is a mode in which a failure diagnosis of the master controller 3A itself and a failure diagnosis of the battery packs 5 including a diagnosis of mechanical operations of the relays 7A and 7B are performed. The normal mode is a mode in which the main relays 4A and 4B are turned on to proceed to a normal battery control, and thus controlling the charging and discharging by the battery packs 5 (the assembled battery 2) is started. The mode setting part 22C sets the voltage detection mode to the failure diagnosis mode when the start switch 11 is switched from OFF to ON.

When the failure detection mode is set at the time of start-up of the master controller 3A, the abnormality detection part 22B performs a failure diagnosis of the master controller 3A itself, a failure diagnosis of the battery packs 5, and a mechanical operation diagnosis of the relays 7A and 7B (a diagnosis of whether there is fused-connection or fused-cut-out of the relays 7A and 7B).

As the mechanical operation diagnosis, the abnormality detection part 22B outputs, for example, a command to turn off the relay 7A when the relay 7B is turned on. When the voltage that should be zero under a normal condition is greater than zero, the abnormality detection part 22B determines that the relay 7A is in a fixed ON state, and detects the fixed ON state of the relay 7A. The mode setting part 22C sets the voltage detection mode to the normal mode when, as a result of executing the failure diagnosis mode, the failure diagnosis has been completed without detecting failure of the master controller 3A itself and without detecting failure of the battery packs 5 and the fused-connection or fused-cut-out of the relays 7A and 7B.

The communication scheme setting part 30A sets the communication scheme to at least one of the first communication scheme and a second communication scheme according to the voltage detection mode. In the present embodiment, when the voltage detection mode is set to the normal mode, the communication scheme setting part 30A sets the communication scheme only to the first communication scheme.

The first communication scheme is a communication scheme which is pre-set on the system side for the entire vehicle system. In the first communication scheme, communication by the communication part 23A is performed by a first communication period T1. In the first communication scheme, communication is performed by the first communication period T1 between the master controller 3A and the vehicle control device 10, between the master controller 3A and the slave controller 3B, and between the master controller 3A and the slave controller 3C.

As mentioned above, basic configurations of the slave controller 3B and the slave controller 3C are the same as that of the master controller 3A, except that the master controller 3A reads and executes a master-side program related to the master-slave configuration.

That is, the slave controllers 3B and 3C read and execute a slave-side program according to the master-slave configuration, and perform a necessary control under the control of the master controller 3A. The communication parts 23B and 23C of the slave controllers 3B and 3C communicate only with the communication part 23A of the master controller 3A under the master-slave configuration.

With regard to this, when the communication scheme is set to the first communication scheme, the power supply device 1 collectively transmits instruction signals or results of events such as voltage detection of the battery cells 6, at an edge timing of the predetermined first communication period T1.

On the other hand, the second communication scheme is a communication scheme in which, only during a diagnosis of a mechanical operation of a mechanical component such as a relay or the like, communication is performed between the master controller 3A and the slave controller 3B and between the master controller 3A and the slave controller 3C under the master-slave configuration of the battery monitoring system 3. In the second communication scheme, communication by the communication parts 23A, 23B, and 23C is performed by a second communication period T2 that is shorter than the communication period of the first communication scheme. In the second communication period T2, results of events related to the mechanical operation diagnosis such as determination of fixation of the relays 7A and 7B are collectively transmitted at an edge timing of the predetermined second communication period T2.

Next, a failure diagnosis process executed by each of the battery controllers 3A, 3B, and 3C according to the present embodiment when the failure diagnosis mode is set is described with reference to FIGS. 3 and 4.

Figure 3:
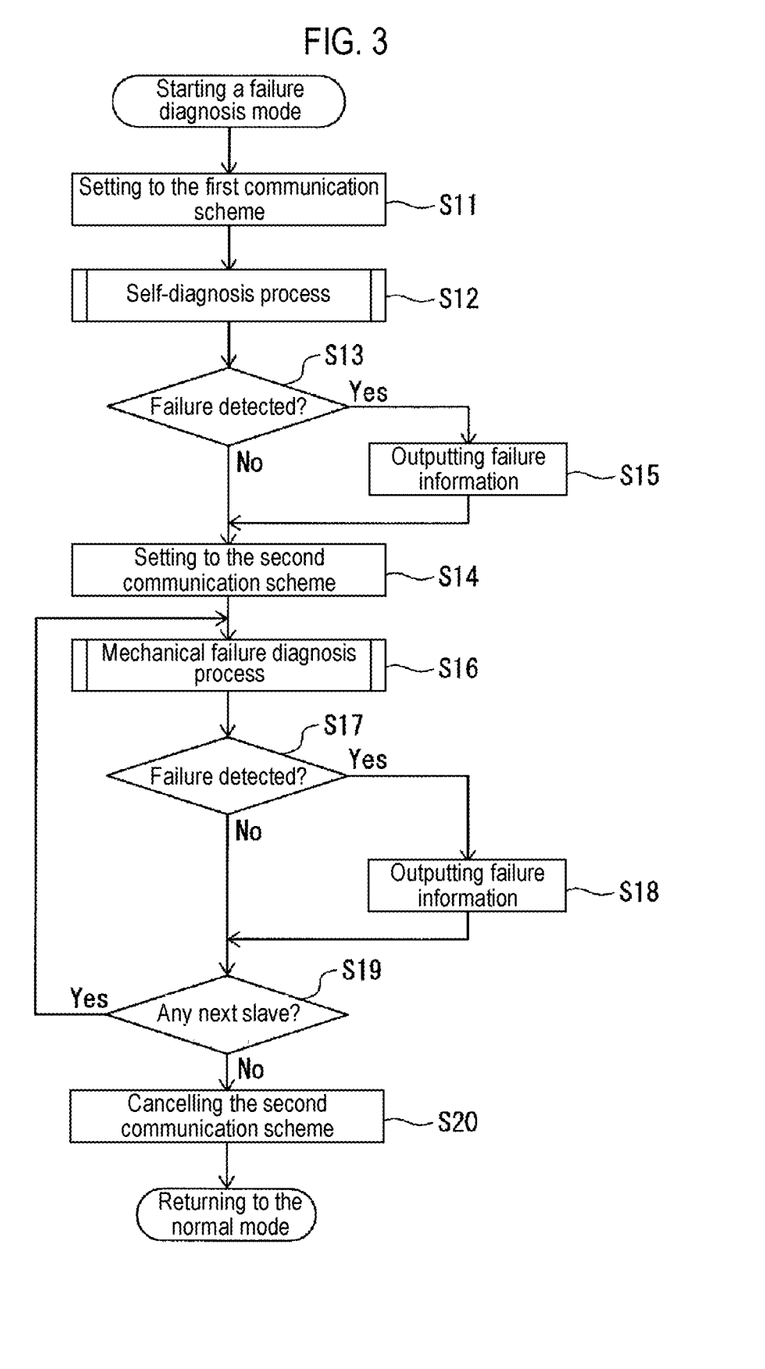
FIG. 3 is a flowchart of a failure diagnosis process executed by a master controller.

When the failure diagnosis process is executed by each of the battery controllers 3A, 3B, and 3C, in the master controller 3A, the flow proceeds to step S11 to set the communication scheme to the first communication scheme, and then proceeds to S12 to start a self-diagnosis, as shown in FIG. 3.

Figure 4:
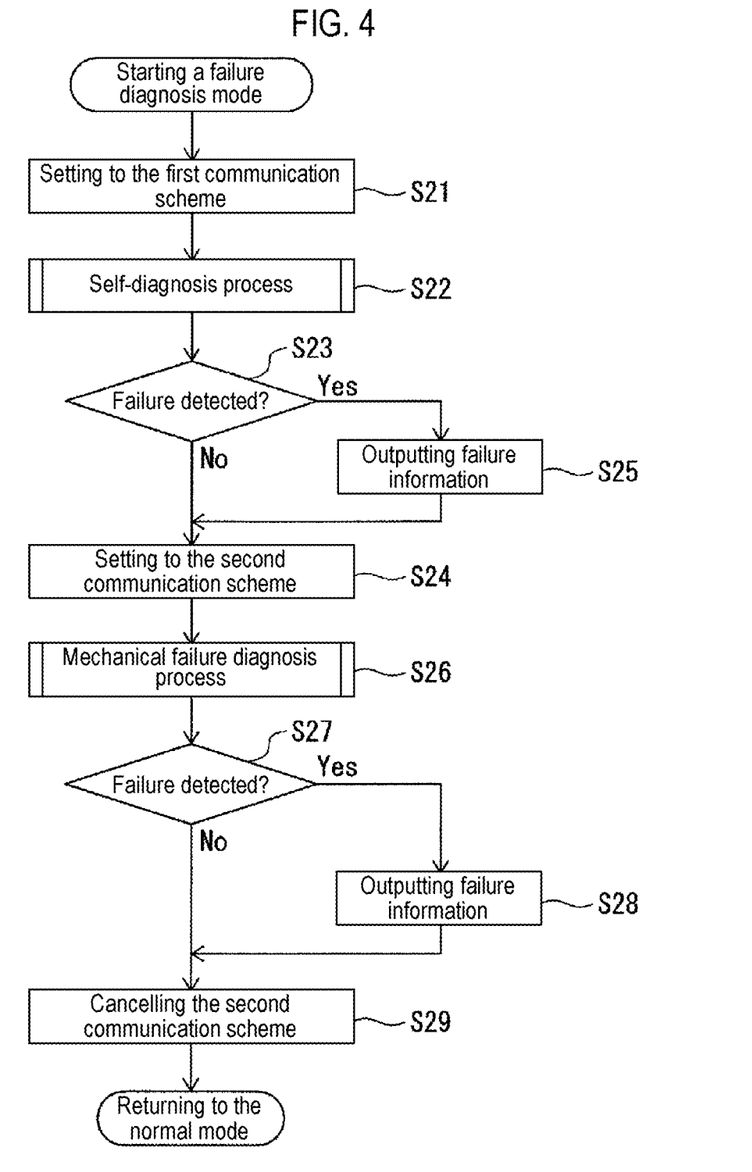
FIG. 4 is a flowchart of a failure diagnosis process executed by a slave controller.

Similarly, when the failure diagnosis process is executed, in the slave controllers 3B and 3C, the flow proceeds to step S21 to set the communication scheme to the first communication scheme under the control of the master controller 3A, and then proceeds to step S22 to start a self-diagnosis, as shown in FIG. 4. During the self-diagnosis, communication related to each event is performed at an edge timing of a certain first communication period T1.

In the master controller 3A, the flow proceeds to subsequent step S13 to determine whether or not a failure has been detected in the master controller 3A itself and in another battery controller as a result of the self-diagnosis, as shown in FIG. 3. When no failure is detected in the master controller 3A itself and in another battery controller (if "No"), the flow proceeds to step S14. When a failure is detected in the master controller 3A itself or in another battery controller (if "Yes"), the flow proceeds to step S15 where failure information is outputted to the vehicle control device 10 by the first communication scheme. Then, the flow proceeds to step S14.

In step S14, the communication scheme is set to the second communication scheme. Then, in step S16, a mechanical failure detection process is performed. In the mechanical failure detection process, failure detection of the battery packs 5 and diagnosis of mechanical operation of a mechanical component (such as detection of fixation of the relay 7A or 7B) are sequentially performed by the master controller 3A itself and another battery controller.

Similarly, in the slave controllers 3B and 3C, the flow proceeds to step S23 to determine whether or not a failure has been detected as a result of the self-diagnosis, as shown in FIG. 4. When no failure is detected (if "No"), the flow proceeds to step S24. When a failure is detected in the battery controller itself (if "Yes"), the flow proceeds to step S25 where the failure information thereof is outputted to the master controller 3A by the first communication scheme. Then, the flow proceeds to step S24. In step S24, the communication scheme is set to the second communication scheme, and the flow waits. If an instruction is received from the master controller 3A, the flow proceeds to step S26 to perform a mechanical failure detection process under the control of the master controller 3A.

Subsequently, in the master controller 3A, the flow proceeds to subsequent step S17 to determine whether or not a mechanical failure has been detected as a result of the mechanical operation diagnosis, as shown in FIG. 3. When no failure is detected by the master controller 3A itself and by another battery controller (if "No"), the flow proceeds to step S19. When a failure is detected by the master controller 3A itself and by another battery controller (if "Yes"), the flow proceeds to step S18. In step S18, failure notification information related to mechanical failure content of the battery packs 5 is outputted from the communication part 23A of the master controller 3A to the vehicle control device 10 by the first communication scheme. Then, the flow proceeds to step S19.

In step S19, the master controller 3A determines whether or not there is a slave controller which has not executed the mechanical operation diagnosis. If there is a slave controller that has not executed the diagnosis, the flow proceeds to step S16 to execute the mechanical operation diagnosis of the slave controller as a next slave controller to execute the mechanical operation diagnosis. Here, communication is performed between the master controller 3A and the slave controller 3B and between the master controller 3A and the slave controller 3C by the second communication scheme using the second communication period T2.

When there is no slave controller corresponding to the next slave controller in step S19 (if "No"), the master controller 3A terminates the mechanical operation diagnosis. The flow proceeds to step S20. Each of the battery controllers 3A, 3B, and 3C terminates the second communication scheme and sets the communication scheme to the first communication scheme only, and each of the battery controllers 3A, 3B, and 3C connects the relays 7A and 7B. The flow is returned to the normal mode.

In the slave controllers 3B and 3C, when receiving an instruction to execute the mechanical operation diagnosis from the master controller 3A by the second communication scheme using the second communication period T2, as shown in FIG. 4, the flow proceeds to step S26 to execute the mechanical failure detection process. In step S27, the slave controllers 3B and 3C determine whether or not mechanical failure thereof is detected as a result of the mechanical operation diagnosis. When no mechanical failure is detected (if "No"), the flow proceeds to step S29. When mechanical failure is detected (if "Yes"), the flow proceeds to step S28.

In the slave controllers 3B and 3C, in step S28, failure notification information regarding mechanical failure content of the battery packs 5 is outputted from the communication parts 23B and 23C of the slave controllers 3B and 3C to the master controller 3A by the second communication scheme, as shown in FIG. 4. Then, the flow proceeds to step S29.

In step S29, the slave controllers 3B and 3C terminate the second communication scheme and set the communication scheme to the first communication scheme only. Upon receiving an execution instruction from the master controller 3A, each of the battery controllers 3B and 3C connects the relays 7A and 7B and returns the process to proceed to the normal mode.

Next, operations and effects during a failure diagnosis, which are performed before starting battery control, are described.

In the power supply device 1 according to the present embodiment, when the start switch 11 is turned on, the vehicle control device 10 starts up the battery monitoring system 3 of the power supply device 1 to start a failure diagnosis. Each of the battery controllers 3A, 3B, and 3C performs a self-diagnosis of the battery controller itself and a mechanical failure diagnosis of each of the battery packs 5 at the time of start-up of the system.

Even when the start switch 11 is turned on and charging of each of the battery packs 5 is started, the master controller 3A of the power supply device 1 similarly executes the failure diagnosis of each of the battery packs 5. In the following description of the operations, the flow will be described by focusing on the master controller 3A.

When the failure diagnosis is started, each of the battery controllers 3A, 3B, and 3C sets the communication scheme to the first communication scheme (steps S11 and S21). Under the control of the master controllers 3A, a series of self-diagnosis processes are simultaneously performed in parallel in the battery controllers 3A, 3B, and 3C (steps S12 and S22).

The self-diagnosis results of the slave controllers 3B and 3C are transmitted respectively between the master controller 3A and the slave controller 3B (step S25) and between the master controller 3A and the slave controller 3C (step S25) by the first communication period T1. Thus, the self-diagnosis is completed.

When a failure of the control circuit in itself or in another battery controller is detected through the failure detection process in the self-diagnosis (if "Yes" in step S13), the master controller 3A outputs failure notification information regarding failure content from the communication part 23A to the vehicle control device 10 by the first communication scheme (step S15). As described above, during the self-diagnosis, communication related to each event is performed at the first communication period T1 set on the system side. Here, it is assumed that no failure is detected during the self-diagnosis.

Subsequently, the master controller 3A performs mechanical operation diagnosis of mechanical components such as the relays 7A and 7B. As the operation diagnosis of the mechanical components, for example, fixation of the relays 7A and 7B (ON-fixation and OFF-fixation) or the like is diagnosed (step S16).

When a mechanical failure is detected by the master controller 3A or by the slave controllers 3B and 3C (if "Yes" in step S17), the master controller 3A outputs failure notification information regarding failure content to the vehicle control device 10 by the first communication scheme (step S18).

When no mechanical failure is detected by the master controller 3A and by the slave controllers 3B and 3C, the master controller 3A turns on the relays 7A and 7B to complete the failure diagnosis, and the flow proceeds to the normal battery control (step S20). As a result, the power supply from the battery packs 5 (the assembled battery 2) to an external load such as the motor generator 8 or the like is started.

As described above, the power supply device 1 according to the present embodiment has a synchronous master-slave configuration in which one master controller 3A serves as a master and other battery controllers 3B and 3C serves as slaves. When the battery controllers 3A, 3B, and 3C operate in cooperation with one another, the communication parts 23A, 23B, and 23C take synchronization at a common communication period, and performs communication of necessary information such as instruction signals and failure diagnosis results between the master controller 3A and the slave controllers 3B and 3C.

Figure 5:
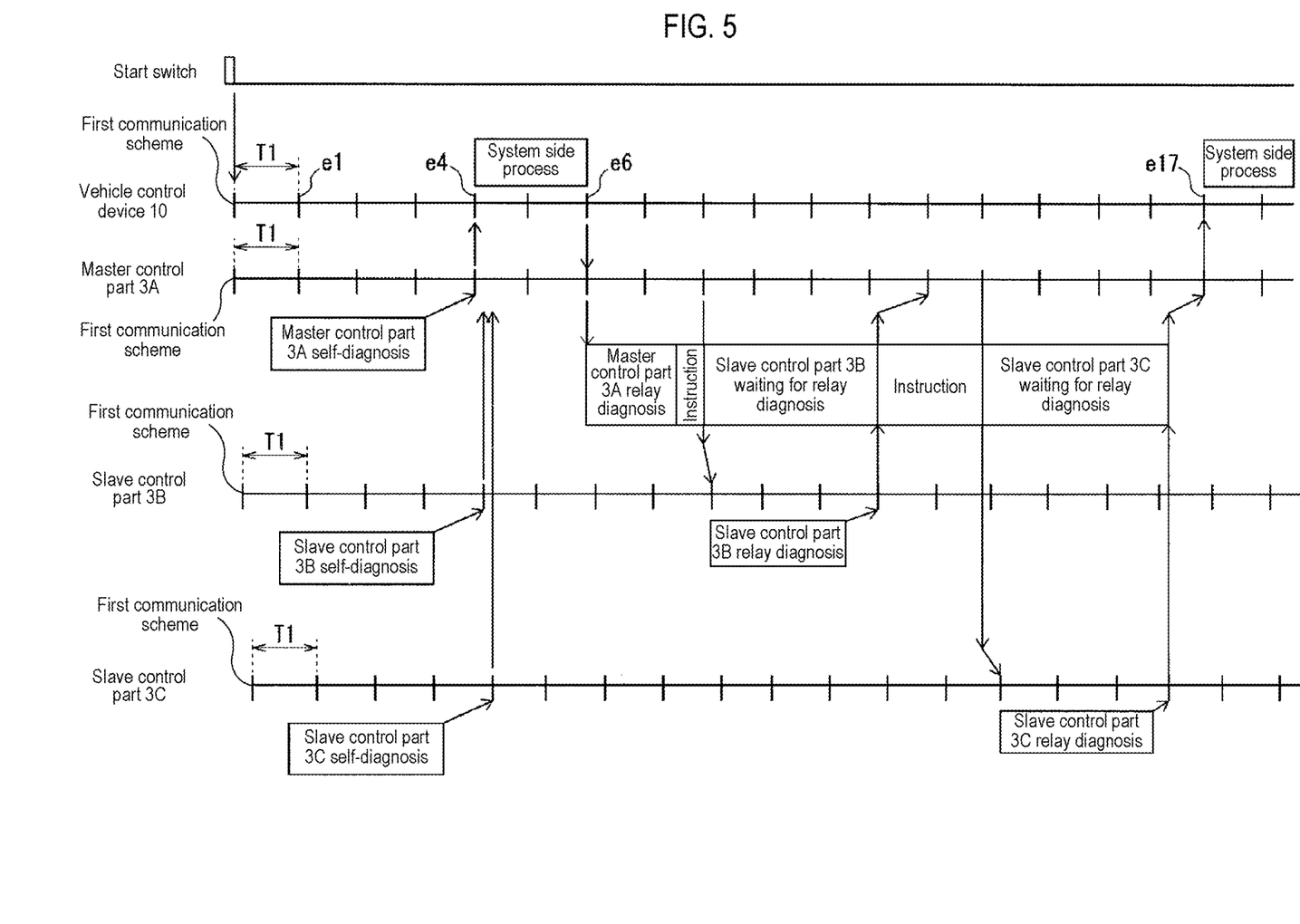
FIG. 5 is a time chart for explaining a communication state in a comparative example, and shows a diagram illustrating a communication state in which communication is performed by using only a first communication scheme during a self-diagnosis and during a diagnosis of mechanical operation of a mechanical component.

When performing the communication during this failure diagnosis, in the related art, as in a comparative example shown in FIG. 5, the communication between each of the battery controllers 3A, 3B, and 3C and the vehicle control device 10 is performed only by the first communication scheme set on the system side.

In the case of communication using the first communication scheme only, the first communication period T1 is relatively long as shown in FIG. 5. Therefore, even when the failure diagnosis is completed and an attempt is made to transmit diagnostic information, a relatively long wait time is required to wait for an edge in synchronization with a clock signal of the first communication period.

Thus, when many relatively long waiting times occur one after another, the time required for the failure diagnosis becomes longer. In the example shown in FIG. 5, when edges of the clock signal of the vehicle control device 10 are used as a reference, the diagnostic process is completed at the time point of edge e17 of the clock signal, and the result of the process is returned to the system side.

In contrast, in the power supply device 1 according to the present embodiment, during the self-diagnosis, the communication scheme setting part 30 sets the communication scheme to the first communication scheme using the first communication period T1 set on the system side during the mechanical operation diagnosis, the communication scheme setting part 30 sets the communication scheme to the second communication scheme using the second communication period T2, which is shorter than the period of the first communication scheme.

Figure 6:
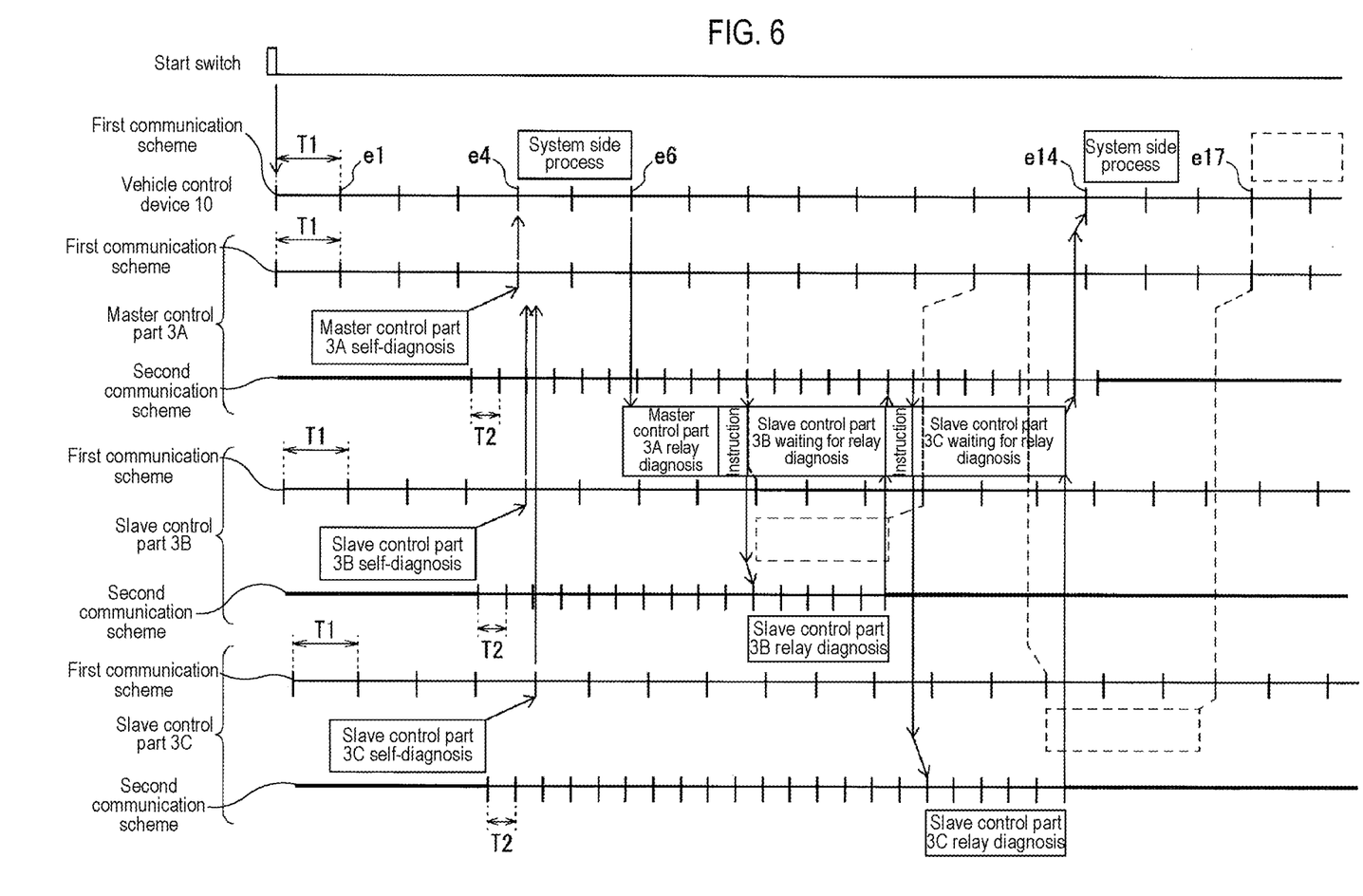
FIG. 6 is a time chart for explaining a communication state according to the present embodiment, and shows a diagram illustrating a communication state in which communication is performed by a first communication scheme during a self-diagnosis and performed by a second communication scheme during a diagnosis of mechanical operation of a mechanical component.

Thus, as an example of the present embodiment shown in FIG. 6, during the self-diagnosis of each of the battery controllers, the master controller 3A and the slave controllers 3B and 3C perform communication using the first communication period T1 set on the system side. During the mechanical operation diagnosis of the mechanical component, the master controller 3A and the slave controllers 3B and 3C perform communication using the second communication period T2, which is shorter than the first communication period T1.

That is to say, in the present embodiment, communication is performed as the communication scheme is changed by the setting part 30 during the self-diagnosis and during the mechanical operation diagnosis. In the example shown in FIG. 6, when edges of the clock signal of the vehicle control device 10 are used as a reference, the diagnostic process is completed at the time point of edge e14 of the clock signal, and the process result is returned to the system side. Accordingly, there is an excellent effect that the processing time is reduced by three periods as compared with edge e17 in the comparative example shown in FIG. 5.

More specifically, in FIG. 6, during the mechanical operation diagnosis, the master controller 3A first determines the ON-fixation of the relay 7A or 7B as an event. The determination of the fixation of the relay includes ON-fixation determination and OFF-fixation determination, both of which are performed. Only the ON-fixation determination is described here. When the ON-fixation of the relay 7A is not detected by the master controller 3A, communication is performed by the second communication scheme between the master controller 3A and the slave controller 3B in synchronization with an edge of the second communication period T2 corresponding to an end timing of an event.

Thus, in the slave controller 3B, the ON-fixation of the relay 7A or 7B is determined as an event. When the slave controller 3B does not detect the ON-fixation of the relay, the slave controller 3B takes synchronization by an edge of the second communication period T2, and communication is performed between the slave controller 3B and the master controller 3A. Subsequently, synchronization is similarly taken by an edge of the second communication period T2, and communication is performed by the second communication scheme between the master controller 3A and the slave controller 3C.

Subsequently, in the slave controller 3C, the ON-fixation of the relay 7A or 7B is similarly determined as an event. When the slave controller 3C does not detect the ON-fixation of the relay, the slave controller 3C takes synchronization by an edge of the second communication period T2, and communication is performed by the second communication scheme between the slave controller 3C and the master controller 3A.

In the power supply device 1 of the present embodiment, when the determination of the fixation of the relay 7A or 7B in each of the controllers 3A, 3B, and 3C is completed in a manner described above, the master controller 3A outputs an instruction to turn on the relays 7A and 7B of each of the controllers 3A, 3B, and 3C. Thereafter, the slave controller 3B and the slave controller 3C turn on the relays 7A and 7B to complete the failure diagnosis. The flow may quickly proceed to a normal battery control.

As described above, the power supply device 1 of the present embodiment includes the plurality of battery controllers 3A, 3B, and 3C having the master-slave configuration. Before each of the battery controllers 3A, 3B, and 3C is started up, during the self-diagnosis being performed, each of the battery controllers 3A, 3B, and 3C performs communication by the first communication scheme set on the system side. Then, during the mechanical operation diagnosis, each of the battery controllers 3A, 3B, and 3C performs communication by the second communication scheme that has a shorter communication period than the first communication scheme. Therefore, it is possible to complete the failure diagnosis in a short time. Accordingly, it is possible to shorten a start-up time of the power supply device 1, thereby shortening a start-up time of the vehicle.

A plurality of units other than the battery monitoring system 3 is connected to the vehicle control device 10. Since communication and processing loads are high, the vehicle control device 10 uses only the first communication scheme using the first communication period T1 which is a relatively long communication period. This is because the use of the second communication scheme using the second communication period T2, which is a relatively short communication period, increases communication and processing loads due to the short communication period.

In addition, there are various types of self-diagnosis for control circuits of the battery controllers 3A, 3B, and 3C.

Therefore, processing loads of the battery controllers 3A, 3B, and 3C during the self-diagnosis are high. When the communication period between the master and the slave is too short, the processing loads of the battery controllers 3A, 3B, and 3C are further increased. Here, the various types of diagnosis include general self-diagnosis of the controller such as a memory check, an AD converter function check, a phase voltage circuit check, a CPU function check, and the like.

On the other hand, in the mechanical operation diagnosis of the relays 7A and 7B for controlling the output from the battery packs 5, since the power supply device 1 of the present disclosure is configured to include the plurality of battery packs 5 connected in parallel to an external load, there is a possibility that when the relays 7A and 7B mounted on the respective battery packs 5 connected in parallel are arbitrarily operated, the mechanical operation diagnosis may not be performed accurately.

Therefore, in the power supply device 1 of the present embodiment, it is necessary to sequentially diagnose the relays 7A and 7B that control the output of each battery pack 5. In other words, since the mechanical operation diagnoses of the relays 7A and 7B are not performed at the same time, it can be said that the processing load of each of the battery controllers 3A, 3B, and 3C of the battery monitoring system 3 is relatively low.

Therefore, during the mechanical operation diagnosis of the relays 7A and 7B, even when the communication period between the master and the slave is set as short as possible within a communicable range, communication and processing loads are not significantly increased. In addition, since the serial communication for sequentially transmitting data is a one-to-one correspondence communication, the communication load is low. Thus, the communication and processing loads are not excessive even in the second communication period T2 which has a communication period set as short as possible.

Therefore, in the present disclosure, based on the above-described knowledge, communication by the first communication scheme using the first communication period T1 is adopted during the self-diagnosis being performed first, and communication by the second communication scheme using the second communication period T2 shorter than the first communication period T1 is employed during the mechanical operation diagnosis of the relays 7A and 7B, which is performed after the self-diagnosis. By appropriately combining the first communication scheme and the second communication scheme according to communication and processing loads at the time of diagnosis, the time required for starting a battery control is reduced as a whole.

On the other hand, in the comparative example shown in FIG. 5, for example, even when the master controller 3A has completed the ON-fixation determination of the relay 7A as an event, communication cannot be performed until reaching an edge at which synchronization is taken by the clock signal of the first communication period T1. Thus, a lot of waiting time occurs as in the processes indicated by broken lines in FIG. 6. Therefore, the time until the failure diagnosis is completed, that is, the start-up time of the power supply device 1 becomes longer. In other words, by adopting a long period for the "self-diagnosis" during which the load is high and adopting a short period for the "relay diagnosis" during which the load is low, it is possible to shorten the time required to start a battery charging and discharging control.

In this specification, the term "communication period" refers to a period in which each battery controller gains access to a communication bus. At a timing of the communication period, for example, the battery controller performs a process of reading data on the communication bus. Thereafter, the battery controller performs a process of storing the read data in the memory, a calculation process, a process of writing the calculation result in the memory, and a process of fetching the calculation result to a transmission buffer. At a timing of the next communication period, the battery controller performs a process of transmitting the information in the transmission buffer to the communication bus.

<Other Configuration Example According to Present Disclosure>

Figure 7:
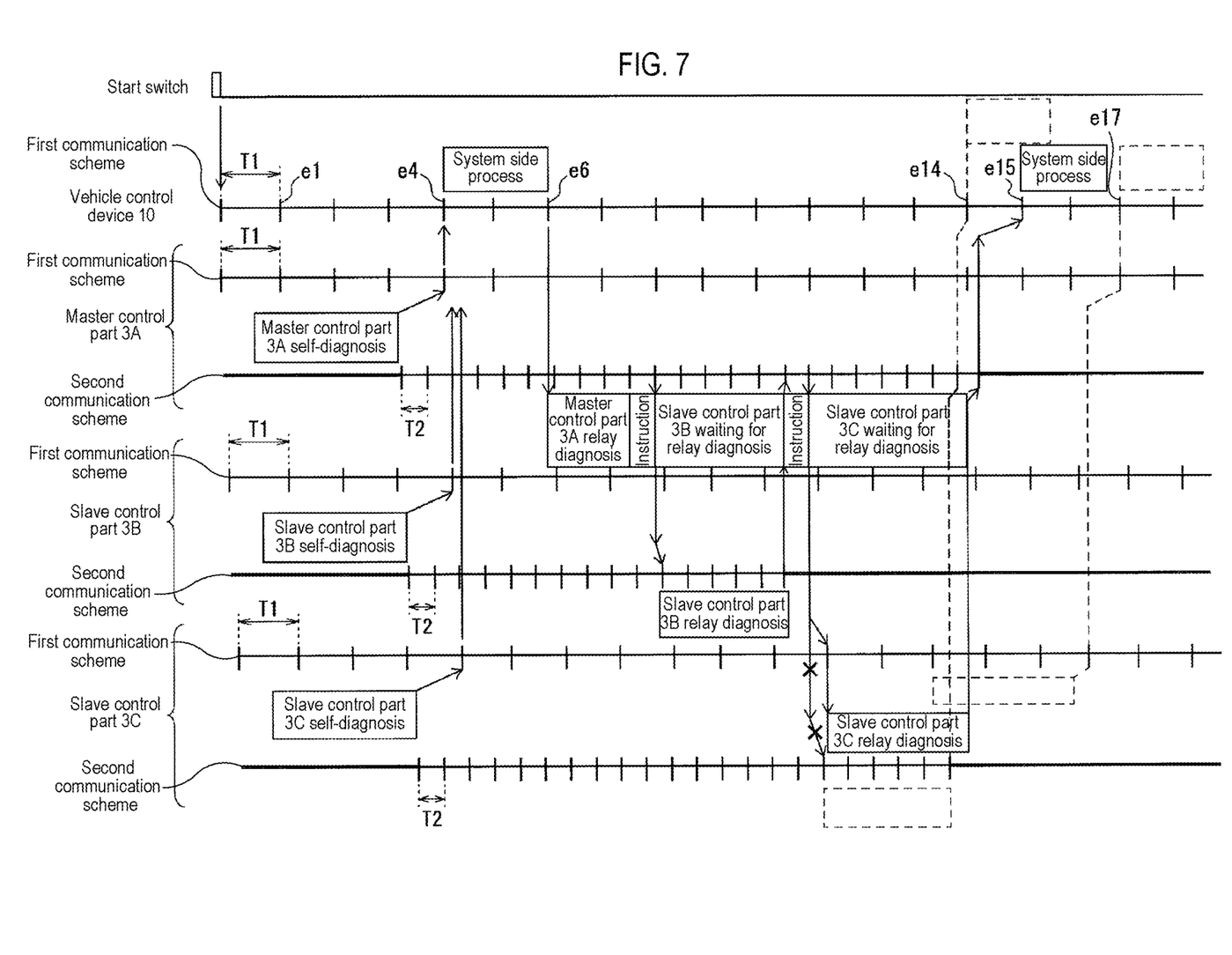
FIG. 7 is a time chart for explaining a modification of the communication state according to the present embodiment, and shows a diagram for explaining a communication example in which a second communication scheme and communication by a first communication period are used in combination during a diagnosis of mechanical operation of a mechanical component.

In the above-described embodiment, there has been described an example in which as shown in FIG. 6, the power supply device 1 performs communication by the second communication scheme during the mechanical operation diagnosis. However, during the mechanical operation diagnosis, communication may be performed by the first communication scheme in addition to the second communication scheme. FIG. 7 is a view illustrating a communication example in which communication is promptly executed even when communication by the second communication scheme fails during the mechanical operation diagnosis.

In this example, the setting parts 30A, 30B, and 30C of the battery controllers 3A, 3B, and 3C of the battery monitoring system 3 set, in addition to the second communication scheme, the first communication scheme as the communication scheme during the mechanical operation diagnosis. The communication parts 23A, 23B, and 23C of the respective battery controllers 3A, 3B, and 3C are configured such that during the mechanical operation diagnosis, communication is performed between the master controller 3A and the slave controllers 3B and 3C by the first communication scheme or the second communication scheme, whichever has a communication period that reaches earlier.

With such a configuration, as shown in FIG. 7, for example, even when the slave controller 3C fails to communicate with the master controller 3A by the second communication scheme (indicated by X marks in FIG. 7), communication can be promptly performed by using an edge in synchronization with the clock signal of the first communication period T1 according to the first communication scheme, without having to wait for a next edge in synchronization with the clock signal of the second communication period T2. Therefore, a subsequent fixation determination process for the relay 7A by the slave controller 3C can be executed earlier.

As described above, the power supply device 1 can more quickly perform the communication related to the failure diagnosis, by performing the communication by the first communication scheme in addition to the second communication scheme during the mechanical operation diagnosis. In the example shown in FIG. 7, when edges of the clock signal of the vehicle control device 10 are used as a reference, the diagnosis process is completed at the point of the edge e15 of the clock signal, and the result of the process is returned to the system side. Accordingly, the processing time is shortened by two periods as compared with the edge e17 of the comparative example shown in FIG. 5.

The power supply device according to the present disclosure is not limited to the above embodiment, and various modifications may be made without departing from the spirit of the present disclosure.

For example, in the above-described embodiment, there has been described an example in which the first communication scheme of taking synchronization with the clock signal of the first communication period T1 is set on the system side. However, the first communication scheme in the present disclosure is not limited thereto. The first communication scheme may be adopted to an aspect in which synchronization is taken by the clock signal having a longer communication period than the second communication scheme.

Furthermore, for example, in the above-described embodiment, there has been described an example in which the signal of the start switch 11 is inputted from the vehicle control device 10 to the master controller 3A and is inputted from the master controller 3A to the slave controllers 3B and 3C. This is also an example only. It may be possible to adopt a configuration in which the signal of the start switch 11 is directly transmitted from the vehicle control device 10 to the master controller 3A and the slave controllers 3B and 3C.

Here, the first communication period T1 and the second communication period T2 set by each of the master controller 3A and the slave controllers 3B and 3C may be switched as follows.

For example, when the start switch 11 is turned on, the master controller 3A may perform communication by the first communication scheme that takes synchronization with the first communication period T1. By the start signal of the mechanical operation diagnosis from the vehicle control device 10, the first communication scheme may be switched to the second communication scheme that takes synchronization with the second communication period T2. The results of the mechanical operation diagnosis may be collected from the slave controllers 3B and 3C. After the information is transmitted to the vehicle control device 10, the communication scheme may be returned to the first communication scheme using the first communication period T1.

In the slave controllers 3B and 3C, when the start switch 11 is turned on, communication may be performed by the first communication scheme. After the self-diagnosis is completed, the first communication scheme may be switched to the second communication scheme. After the mechanical operation diagnosis is completed, the communication scheme may be returned to the first communication scheme using the first communication period T1 (i.e., not under the control of the master controller 3A).

In addition, for example, after completing the failure diagnosis of the relays 7A and 7B of the battery pack 5 controlled by the master controller 3A only, the relays 7A and 7B of the master controller 3A may be immediately turned on to supply power to the external load without having to wait for the communication between the master controller 3A and the slave controllers 3B and 3C. With such a configuration, even when the diagnosis results of the relays of the slave controllers 3B and 3C are abnormal and the power of the battery packs 5 of the slave controllers 3B and 3C cannot be used, it is possible to supply at least the power of the battery pack 5 of the master controller 3A.

The master controller 3A may transmit the self-diagnosis result to the vehicle control device 10 without waiting for the self-diagnosis result of the slave controllers 3B and 3C under a premise of a system configuration in which the vehicle control device 10 executes the relay control. Thus, in the example of the above-described embodiment, there is shown a configuration example in which even when the vehicle control device 10 instructs the mechanical operation diagnosis, the master controller 3A waits until the self-diagnosis result is acquired from the slave controllers 3B and 3C.

Furthermore, the power supply device 1 according to the above-described embodiment may be used as a vehicular power source for other electric vehicles, for example, a railroad vehicle such as a hybrid train or the like, a passenger van such as a bus or the like, a freight vehicle such as a tuck or the likes, and an industrial vehicle such as a battery-powered forklift truck or the like. Furthermore, the power supply device 1 according to the above-described embodiment may be applied to a power supply that constitutes a power supply device other than an electric vehicle, such as an uninterruptible power supply device used in a computer system or a server system, a power supply device used in a private power generation facility, or the like.

In addition, for example, in the above-described embodiment, there is illustrated the battery cell 6 including a lithium ion secondary battery. However, the present disclosure is not limited thereto. The present disclosure may be applied to the battery cell 6 including other secondary batteries such as a nickel hydrogen battery and the like, in addition to the lithium ion secondary battery.

EXPLANATION OF REFERENCE NUMERALS

1: power supply device, 2: assembled battery, 3: battery monitoring system, 5: battery pack, 6: battery cell, 3A: master controller (battery controller), 3B: slave controller (battery controller), 3C: slave controller (battery controller), 22: monitoring part, 30A, 30B, and 30C: (communication scheme) setting part, 23A, 23B, and 23C: communication part

What is claimed is:

1. A power supply device, comprising:
a plurality of battery packs connected in parallel to a load;
a plurality of battery controllers corresponding to the plurality of battery packs in a one-to-one correspondence; and
a relay configured to connect or disconnect each of the battery packs to or from the load,
wherein the plurality of battery controllers has a master-slave configuration including a master controller and at least one slave controller, and each of the master controller and the at least one slave controller is configured to execute a self-diagnosis and a mechanical operation diagnosis of a mechanical component including the relay before connecting the battery packs to the load,
wherein each of the master controller and the at least one slave controller is configured to perform communication between the master controller and the at least one slave controller by using a first communication scheme and a second communication scheme that has a communication period shorter than a communication period of the first communication scheme,
wherein during executing the self-diagnosis, the master controller and the at least one slave controller are configured to perform the communication by using the first communication scheme, and
wherein during executing the mechanical operation diagnosis, which is executed after the executing the self-diagnosis is completed, the master controller and the at least one slave controller are configured to perform the communication by using the second communication scheme.

2. The power supply device of claim 1, wherein the master controller and the at least one slave controller are configured to, during executing the mechanical operation diagnosis, perform the communication between the master controller and the at least one slave controller by the first communication scheme or the second communication scheme, whichever has the communication period that reaches earlier.

3. The power supply device of claim 1, wherein when the master controller determines through the self-diagnosis and the mechanical operation diagnosis that at least the master controller has no abnormality, the master controller proceeds to a normal battery control without waiting for a diagnosis result of the at least one slave controller.

4. The power supply device of claim 1, wherein the power supply device supplies DC power, which is to be converted to three-phase AC power via an inverter, to a motor generator in response to a request from a vehicle's system side.

5. The power supply device of claim 4, when charging is necessary in accordance with determination of a vehicle control device mounted on the vehicle's system side, the power supply device stores DC power converted via the inverter from three-phase AC power generated by the motor generator.

6. The power supply device of claim 1, wherein each of the battery packs includes a plurality of battery cells connected in series.

7. The power supply device of claim 6, wherein each of the plurality of battery cells comprises a lithium ion secondary battery or a nickel hydride secondary battery.

8. The power supply device of claim 1, wherein each battery pack is connected to a motor generator by turning on the relay that controls an output from the battery pack, and is disconnected from the external load by turning off the relay.

9. The power supply device of claim 5, wherein the master controller and the at least one slave controller are connected by a communication bus that is different from a communication bus that connects the master controller and the vehicle control device.

10. The power supply device of claim 1, wherein the master controller includes an input part, an output part, a monitoring part, and a communication part, and the monitoring part includes a Central Processing Unit, Read Only Memory, Random Access Memory, an internal clock circuit.

* * * * *